US005216281A

United States Patent [19]

Butler

[11] Patent Number: 5,216,281

[45] Date of Patent: * Jun. 1, 1993

[54] SELF SEALED ALIGNED CONTACT INCORPORATING A DOPANT SOURCE

[75] Inventor: Douglas Butler, Colorado Springs, Colo.

[73] Assignee: Ramtron Corporation, Colorado Springs, Colo.

[ * ] Notice: The portion of the term of this patent subsequent to Aug. 27, 2008 has been disclaimed.

[21] Appl. No.: 750,098

[22] Filed: Aug. 26, 1991

Related U.S. Application Data

[63] Continuation-in-part of Ser. No. 505,242, Apr. 5, 1990, Pat. No. 5,043,790.

[51] Int. Cl.[5] ...................... H01L 23/48; H01L 29/44

[52] U.S. Cl. ................................... 257/750; 257/760; 257/773

[58] Field of Search ........................ 357/65, 68, 71, 67

[56] References Cited

U.S. PATENT DOCUMENTS 4,556,897 12/1985 Yorikane et al. ..................... 357/71
4,570,331 2/1986 Eaton, Jr. et al. .................... 357/51
4,686,000 8/1987 Heath .................................. 357/41
4,784,973 11/1988 Stevens et al. ...................... 437/200
4,811,078 3/1989 Tigelaar et al. ....................... 357/54
4,897,709 1/1990 Yokoyama et al. .................. 357/68
5,043,790 8/1991 Butler .................................. 357/68

*Primary Examiner*—Rolf Hille
*Assistant Examiner*—David Ostrowski

[57] ABSTRACT

In a contact structure to a source/drain region (28) nearby a gate electrode (22), a contact sidewall through a thick dielectric is laterally displaced away from the S/D region to widen the contact; the contact sidewall is located over the gate electrode A remnant (60*a*) of a doped silicon layer overlies the S/D and rises up along the sidewall of gate electrode insulation and onto insulation atop the gate electrode, and is insulated from the gate electrode thereby. The doped silicon acting as a dopant for the source/drain region. A nitride, preferably $Si_3N_4$, is located under the thick dielectric and over part of the gate electrode insulation. The $Si_3N_4$ adjoins the doped silicon to enclose the top and sides of the gate electrode with nitride. The bottom of the contact is formed by the doped silicon at some locations and by the nitride at other locations. The contact sidewall through the thick dielectric preferably overlies the $Si_3N_4$ but not the doped silicon. The doped silicon is effective as a dry etch stop and a wet etch stop, and the silicon nitride is effective as an isotropic etch stop. The doped silicon is wholly contained within the contact, and the nitride extends beyond said contact.

14 Claims, 2 Drawing Sheets

26
18
20
16
30
22
14
24
12
10
28

36
34
10

18
20
40a
16
36
22
34
10

36a
40a 50
48
46
52
52
36a
45
45
28
10

26
18
20
16
60

22
14
24
12
10
28

18
20
60a
16

22
10

46
50

48
52
52
60a
45
45
28
10

46
50

48
60a
28
10

SELF SEALED ALIGNED CONTACT INCORPORATING A DOPANT SOURCE

This is a continuation-in-part of Ser. No. 07/505,242 filed Apr. 5, 1990, now U.S. Pat. No. 5,043,790 dated Aug. 27, 1991.

FIELD OF THE INVENTION

The present invention relates to fabrication processes for manufacturing transistors and other devices in integrated circuits, and particularly concerns the formation of contact windows to obtain improved step coverage despite small geometry design rules.

BACKGROUND OF THE INVENTION

While the present invention is not limited to field effect transistors, and may find application in bipolar, CMOS, or other semiconductor technology, reference will be made to field effect transistors, often referred to as MOS transistors. Fundamentally, MOS transistors generally include highly doped regions called sources and drains in a semiconductor surface, having a gate region or channel between the source and drain regions. A gate electrode is located above and electrically biased to form or eliminate the channel. MOS transistors are separated from nearby transistors or other devices by an isolation technique. Two prevalent techniques are the use of a thick field oxide or a field shield. The field shield approach is disclosed, for example, in U.S. Pat. No. 4,570,331, entitled "Thick Oxide Field-Shield CMOS Process," issued on Feb. 18, 1986 to Inmos Corporation upon the application of S. Sheffield Eaton and Cheng-Cheng Hu.

In addition to isolating the transistor, for there to be utility, connections must be made to the source, drain and gate of the transistor. MOS transistors used in integrated circuits generally include a thick interlevel dielectric which is added on top of the transistor structure. After the dielectric is in place, at some time contact windows are etched to allow contacts to be made to the transistor source, drain and gate. When very small geometries are used, the contact window tends to have an "aspect ratio" (height divided by base) that becomes too large (i.e. greater than 0.5), resulting in poor step coverage by a sputtered or evaporated conductor. The narrow "base" dimension (such as the width of a source/drain region) is small because of the small geometries, though the thickness of interlevel dielectric remains relatively large. In consequence, a main object of the present invention is to provide a structure and process which protects elements of the transistor from such dangers of etching and simultaneously allows larger windows to be constructed even in small geometries.

It will be understood that the preferred form of the invention involves the use of a titanium nitride (TiN) layer covering a titanium silicide ($TiS_2$) region that is found in the contact area. This part of the combination is known to the semiconductor industry, and reference may be had to Stevens, McClure and Hill, U.S. Pat. No. 4,784,973 issued on Nov. 15, 1988 to INMOS Corporation, entitled "Semiconductor Contact Silicide/Nitride Process with Control for Silicide Thickness." That patent explains also that titanium nitride can be used as a metallurgic barrier against reactions between a silicon substrate and an aluminum contact material to a source or drain, for example. The '973 patent discloses a process using a control layer located in the contact opening and formed illustratively of a compound of silicon, oxygen and nitrogen, or silicon oxide. A layer of titanium is added, and titanium silicide is formed under the control layer, and titanium nitride is formed above the control layer. It may also be noted, however, that the titanium is added *after* a relatively thick layer of dielectric such as BPSG is established.

By way of further background, an application of the combination of titanium nitride with titanium silicide is discussed by Tang, Wei, Haken, Holloway, Wan and Douglas in "VLSI Local Interconnect Level Using Titanium Nitride," *International Electron Devices Meeting* 1985 (IEDM 85), pp. 590–93. Tang et al. use the titanium nitride for local interconnects.

The present invention has further aspects, however, than merely locating a titanium nitride layer over the contact area. These further aspects are discussed infra.

SUMMARY OF THE INVENTION

The present invention has many aspects which will be understood from studying the description of the preferred embodiment, infra. However, it may generally be stated that according to some aspects of the invention, a layer of a transition metal nitride, preferably titanium nitride (TiN), is formed over the transistor source, gate electrode, and drain regions. Preferably, a blanket layer of titanium nitride is formed which covers the top and sides of the dielectric insulated gate electrode, and the bottom and side walls of the openings for the source and drain regions. Where field shield isolation is provided, the nitride layer also preferably covers the top surface of the field shield isolation transistors. This nitride layer is one element of a composite nitride structure.

A second element of the composite nitride structure used in the present invention is a second nitride layer formed on top of the first nitride layer. Preferably, the second nitride layer is formed directly on top of and in contact with the first nitride layer. Preferably the second nitride layer comprises or constitutes silicon nitride. Thus, a two layer composite structure is formed—at least temporarily—on the side walls and preferably over the top of the gate electrode. A spacer will be provided between the gate electrode sidewall and the first layer, and the spacer may comprise a dielectric such as silicon dioxide or silicon nitride. Preferably the composite is added prior to establishing a relatively thick interlevel dielectric over the environs.

The composite structure may include a third layer which is located only where the composite traverses a source or drain region. Thus, a third layer, preferably titanium silicide, is created as a lowermost layer. Typically, the titanium silicide will form in the substrate itself extending downward from the top surface of the substrate in the designated source/drain region, and extend into the substrate (but not nearly as far as the source/drain region extends into the substrate).

One beneficial effect of the second nitride layer, preferably silicon nitride, is to prevent oxidation of the first nitride layer. Prevention of oxidation occurs where the second nitride layer is silicon nitride and the first nitride layer is titanium nitride. A further advantage of this combination is that in the process flow, the second nitride layer is patterned without affecting or defining the first nitride layer. In a subsequent step, the patterned second nitride layer is used to replicate its own pattern in the first nitride layer. The second nitride layer can now be removed, or removal can occur later in the process.

Next, a further layer of a nitride can be deposited over the region in an embodiment of the present invention and covers the top of the existing one or two nitride layers. Then a relatively thick dielectric may be added. At some time thereafter, contact windows to the source/drain regions can be defined and etched anisotropically. The presence of the TiN structure over the gate electrode or field shield will prevent the dielectric from being removed from these regions during the contact window etching where the contact window overlaps these regions. This will prevent undesired electrical contact between source/drain and gate or field shield.

Next, in an embodiment of the present invention, the contact window in the thick dielectric is widened, preferably using a wet etch process before photoresist is removed. The wet etch preferably does not appreciably etch the photoresist, the first nitride layer or the further nitride. Thus, the composite structure prevents the wet etch from etching to the gate or field shield electrodes thereby creating unwanted electrical contact. The widened window allows a wider self-aligned contact that will not short to the gate electrode or a field shield electrode. Better step coverage results.

In another embodiment of the present invention, a layer of silicon is established over the transistor source, gate electrode, and drain regions. Preferably, a blanket layer of silicon is established which covers the top and sides of the dielectric insulated gate electrode, and the bottom and side walls of the openings for the source and drain regions. Where field shield isolation is provided, the silicon layer also preferably covers the top surface of the field shield isolation transistors. The silicon layer is then doped.

Since the doped silicon layer is established over the source/drain region, the layer will act as the dopant source for the region. Accordingly, the layer acts as an auto doping source for the structure. A layer of nitride, dielectric and contact windows can then be formed as described supra.

In a further embodiment of the present invention, the contact windows can then be widened.

BRIEF DESCRIPTION OF THE DRAWINGS

In describing a preferred embodiment of the present invention, reference is made to accompanying drawings wherein.

DESCRIPTION OF PREFERRED EMBODIMENTS

Figure 1:
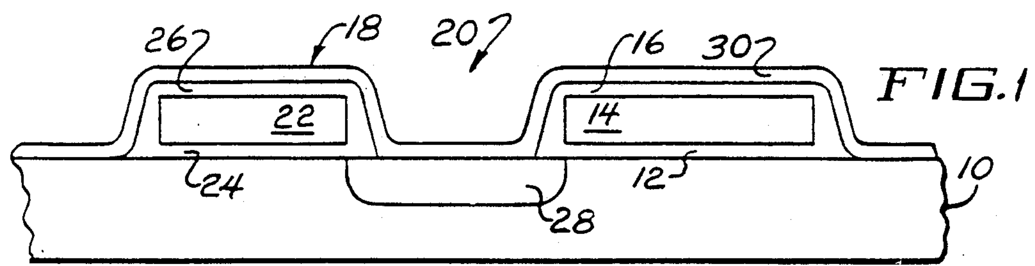
FIG. 1 represents a sectional view (not to scale) of a formed transistor next to a field-shield isolation transistor structure in an integrated circuit, in a process according to the present invention.

Referring to FIG. 1, part of a field effect MOS transistor (on the left) next to a field shield isolation transistor portion (on the right) is depicted in a sectional representation. This view represents an intermediate step during formation of the integrated circuit. As shown, a substrate 10 is a semiconductor wafer, preferably of a suitably doped single crystal silicon. It will be understood that the silicon can be lightly doped. Further, an expitaxial layer can be included. Substrate 10 is intended to be representative as are other portions of the transistor. A dielectric 12 is preferably silicon oxide having a thickness on the order of 0.05 to 0.1 microns deposited upon or grown upon the top surface of substrate 10. Above oxide 12 is a field shield gate electrode 14 which is preferably polycrystalline silicon ("polysilicon") having a thickness typically on the order of 0.1 to 0.4 microns. A dielectric 16 is shown above and in contact with the field shield gate electrode 14. Dielectric 16 is formed illustratively of silicon oxide or silicon nitride and has a thickness on the order of 0.1 to 0.3 microns. These structures provide a field shield isolation transistor so that the gate electrode thereof can be grounded to turn the field shield isolation transistor off. It will be understood that field oxide could be used instead of the superior field-shield technique. In general, the element next to the region to which contact is to be made is not limited by the present invention—and may comprise isolation or other structures.

As mentioned, the MOS transistor is formed to the left of the exemplary field shield isolation transistor gate electrode 14. Accordingly, a gate electrode general structure 18 is shown at the left of FIG. 1. Between gate electrode structure 18 and field shield electrode 14 is a region 20. Gate electrode structure 18 comprises a gate electrode 22 preferably formed of doped polysilicon. Beneath electrode 22 is a relatively thin dielectric 24, usually silicon oxide having a thickness on the order of 0.015 through 0.03 microns. Dielectric 24 isolates gate electrode 22 from the upper surface of substrate 10. On the top and sides of gate electrode 24 is a further dielectric 26 formed preferably of silicon oxide or silicon nitride having a thickness on the order illustratively of between 0.15 and 0.4 microns. Further elements may be included in the gate electrode structure 18.

A source/drain region 28 is shown beneath region 20. It is formed by dopants that have been introduced by implantation preferably, or by other methods such as diffusion. Preferably, source/drain region 28 is doped to a concentration in the range of $10^{17}$ to $10^{18}$ ions per cubic centimeter, or more.

Next, a layer 30 of a transition metal, preferably titanium, is deposited or otherwise established over a first region which comprises the entire structure of FIG. 1.

This can be added by sputtering, for example, to a thickness nominally of 0.02 microns. This results in the structure of FIG. 1.

Figure 2:
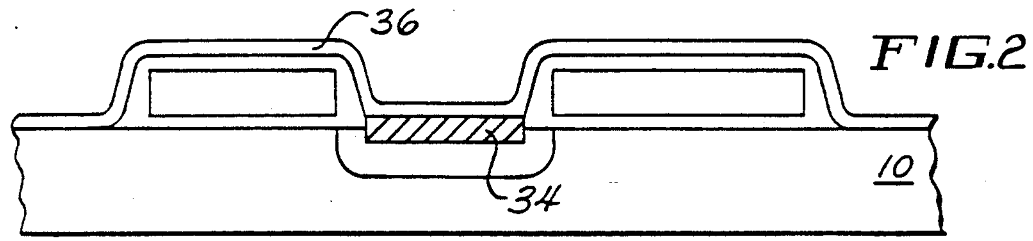
FIG. 2 illustrates the structure of FIG. 1 at a subsequent processing stage after a first nitride layer has been formed, and after a silicide region has been formed in the source/drain region.

The structure of FIG. 1 is then annealed or reacted at an elevated temperature in a nitrogen-containing atmosphere. Illustratively, this step may occur at a temperature of 550° C. in an atmosphere of nitrogen, ammonia, or $N_2+H_2$. The oxygen content of the ambient atmosphere is preferably kept extremely low. Consequently, where the titanium contacts the source/drain region, it reacts with the silicon of substrate 10 to form a conductive titanium silicide region 34 (FIG. 2). The titanium layer also forms a titanium nitride layer 36 above the titanium silicide region 34 and in all other areas where the titanium was deposited (a "first region"). It will be noted that the titanium nitride layer is thinner over the source/drain regions than elsewhere because part of the titanium in those regions has reacted with the silicon of the substrate 10. After reacting with the titanium layer 30, the titanium nitride layer 36 can be made thicker if desired by a second titanium deposition followed by annealing or a reaction in a nitrogen-containing atmosphere, or by reactively sputtering titanium in a chamber containing nitrogen ions. Preferably, the ultimate thickness of TiN layer 36 is in the range of 0.03 to 0.1 microns, and the thickness of silicide region 34 is in the range of 0.012 to 0.2 microns. This is the structure shown in FIG. 2.

Next a second nitride layer 40 is deposited or otherwise established on top of the first nitride layer 36. Preferably, the second nitride layer 40 (not shown) is formed of silicon nitride having a thickness illustratively of about 0.02 to 0.1 microns. This is established conveniently by a chemical vapor deposition of silicon nitride. Layer 40 or portions thereof are sometimes referred to as the "upper nitride layers."

Figure 3:
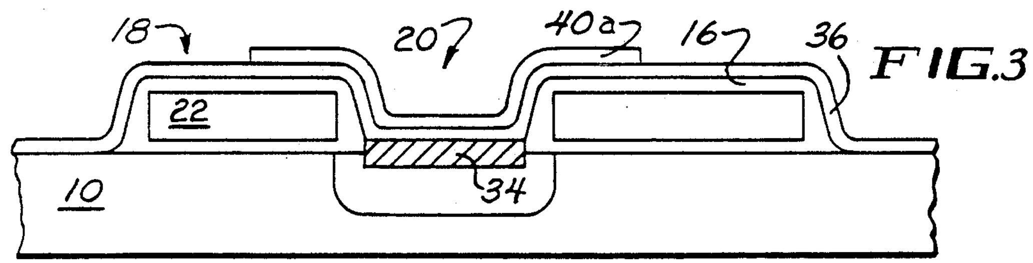
FIG. 3 illustrates the structure of FIG. 2 after a second nitride layer has been added and defined.

The structure of FIG. 2 is now processed using well known photolithographic and etching procedures so that the silicon nitride layer is patterned to leave a portion 40*a* over the region 20 as shown in FIG. 3. It will be seen that portion 40*a* of the upper nitride layer which remains after the etch covers the bottom and side walls of region 20, as well as adjacent portions of the horizontal surfaces next to the windows. More precisely, after this patterning step, portion 40*a* of the upper nitride layer will still be located over part of dielectric 16 and partially cove gate electrode structure 18. After defining the pattern for portion 40*a* in a photoresist layer (not shown), the upper nitride layer can be etched in a plasma comprising carbon tetrafluoride, oxygen, and nitrogen in the approximate ratio of 2:1:3. To avoid leaving unwanted filaments along the vertical side walls of the windows, the silicon nitride etch is preferably isotropic or nearly isotropic. The structure of FIG. 3 results.

Figure 4:
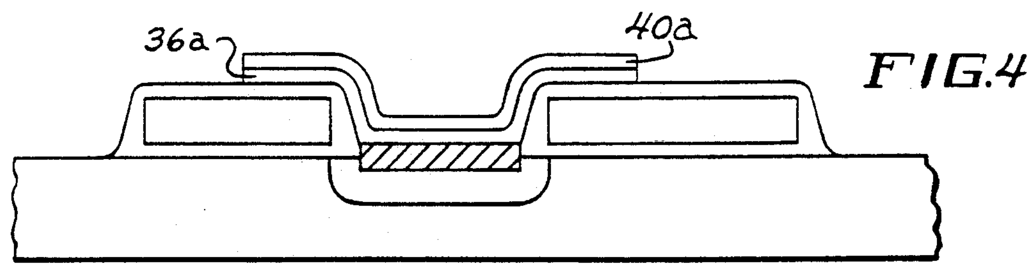
FIG. 4 illustrates the structure of FIG. 3 after the exposed portions of the first nitride layer have been etched away.

After patterning the silicon nitride layer to create portion 40*a*, the exposed portions of the first or lower (titanium) nitride layer 36 can be removed using a wet etch illustratively comprising a solution of ammonium hydroxide, hydrogen peroxide, and water. The portion 40*a* of the silicon nitride layer acts as a mask to protect underlying parts 36*a* of the lower nitride layer 36 in and near region 20. This results in the structure shown in FIG. 4, which shows TiN portion 36*a* substantially coextensive with silicon nitride portion 40.

Figure 5:
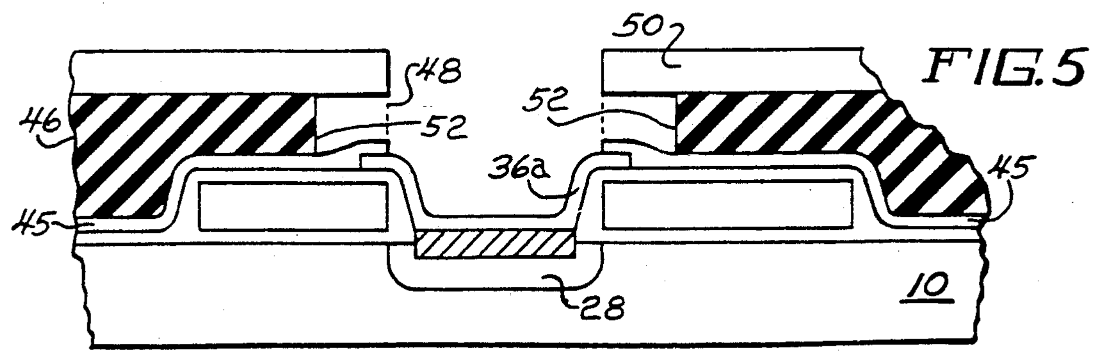
FIG. 5 illustrates the structure of FIG. 4 after a further layer of nitride and an interlevel dielectric has been added, and contact windows have been etched to the source/drain region and shows the subsequent etch result.

Turning now to FIG. 5, after etching away the exposed portions of lower nitride layer 36, the silicon nitride portion 40*a* can be removed. Optionally, it may be left in place. Next, a further nitride layer 45, preferably comprising silicon nitride, is deposited using CVD or any other effective process. This further silicon nitride layer illustratively has a thickness of 0.1 microns, and covers the entire region. This further layer will cover the gate electrode structure 18 and thus seal it.

Next, a thick dielectric layer 46 is deposited over the entire region and flowed smooth to planarize the topography by a thermal cycle preferably of between 850 degrees and 920 degrees (C) at a duration of between about 5 minutes and 20 minutes in an atmosphere containing oxygen or water vapor. Preferably, the thick dielectric layer comprises silicon dioxide doped with phosphorus, phosphorus and boron, or arsenic at suitable concentrations. Alternatively, PSG or BPSG can be used.

A photoresist 50 is placed on top of the thick dielectric patterned as shown in FIG. 5. The thick dielectric layer 46 now may be etched preferably anisotropically using fluorocarbons or chlorocarbons for example to expose layer 36*a* which is electrically connected via silicide region 34 to the source/drain region 28 to which contact is to be made. The side walls resulting from this etch are represented by broken lines 48. It will be seen that side walls 48 terminate on the top surface of the titanium nitride layer portion 36*a*. A portion 46 of thick dielectric layer remains on top of the field-shield isolation structure, and a portion 46 remains on top of the gate electrode structure 18. The space between side walls 48 will often be less than 1 micron. It can have a square, rectangular, or circular opening in plan view.

To improve step coverage of a subsequent metal (or other conductor) deposition by sputtering or evaporation, the next step in the process is to widen the contact window. This is preferably achieved before photoresist 50 is removed. A wet etch process is used which will not etch photoresist 50, titanium nitride portion 36*a*, or silicon nitride 45, but is selective to etch the thick dielectric 46. An aqueous buffered HF solution is suitable.

The window widens in proportion to etch time to result in new side walls 52 which, after an etch of nominally one to five minutes, can be 0.1 to 0.2 microns wider on each side of the window than before the wet etch occurred. The photoresist 50 is preferably left in place to serve as a control to protect against any thinning of dielectric 46 where it should be preserved during this etch, and is removed later.

As a result, a wider contact window in the thick dielectric is created that will not short to the gate electrode 22 or field shield electrode 14, since those elements are sealed by a combination of dielectrics—titanium nitride layer portion 36*a* and silicon nitride 45. This allows improved step coverage *without changing the underlying design rules.*

It will be understood further that this window is self-aligned because the titanium nitride protects the gate electrodes 14, 22 if the window is not properly aligned.

Electrical connections to the source/drain region 28 can now be made through the contact window in both embodiments using interconnect lines of metal, a metal silicide, a doped polycrystalline silicon, or other conductor.

Figure 6:
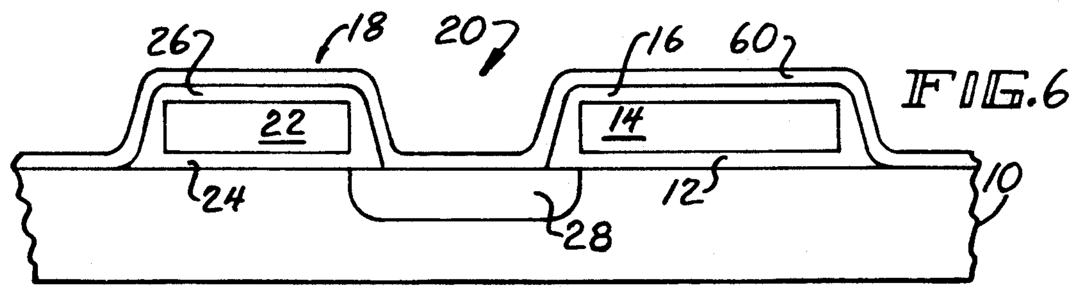
FIG. 6 represents a sectional view (not to scale) of an embodiment of a partially formed transistor next to a field-shield isolation transistor structure in an integrated circuit, according to the present invention.
Figure 7:
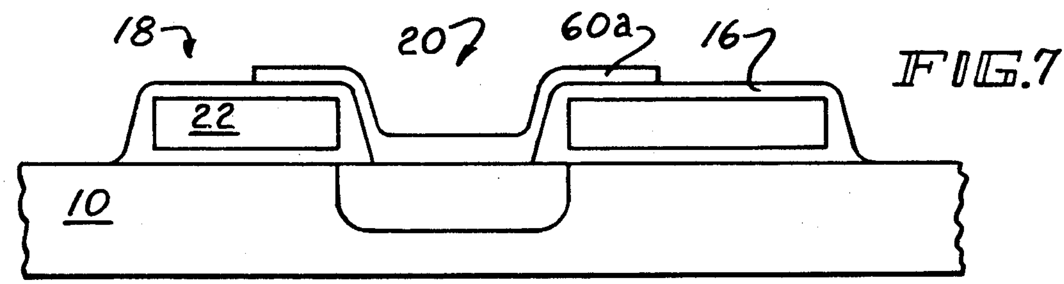
FIG. 7 illustrates the structure of FIG. 6 after the doped silicon layer has been defined.

FIGS. 6–8 illustrate two additional embodiments of the present invention. The structure of FIG. 6 is substantially similar to that of FIG. 1 and is formed in a substantially similar manner except that a layer of a transition metal is not deposited over the structure.

Instead, a silicon layer 60 is established, for example by deposition, over a first region which comprises the entire structure of FIG. 6. Any type of deposited silicon, for example a polysilicon or amorphous silicon, can be used in layer 60.

Preferably, after the silicon has been deposited, it is doped. Silicon layer 60 can be doped by, for example, either depositing doped silicon or implanting the silicon through conventional implant methods. The doped silicon is then heat treated. After the silicon has been doped, the structure is annealed. The doped silicon layer 60 will then act as the dopant for source/drain region 28. Accordingly, layer 60 will act as an auto doping source for the structure.

The structure of FIG. 6 is now processed using well known photolithographic and etching procedures so that the doped silicon layer is patterned to leave a portion 60*a* over the region 20 as shown in FIG. 7. It will be seen that portion 60*a* of the doped silicon layer which remains after the etch covers the bottom and side walls of region 20, as well as adjacent portions of the horizontal surfaces next to the windows. More precisely, after this patterning step, portion 60*a* of the doped silicon layer will still be located over part of dielectric 16 and partially cover gate electrode structure 18.

Figure 8A:
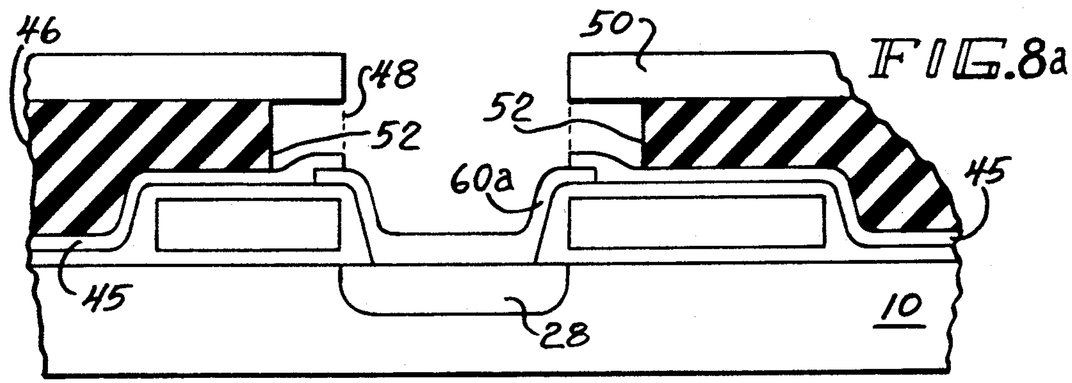
FIG. 8*a* illustrates the structure of FIG. 7 after a further layer of nitride and an interlevel dielectric has been added, and contact windows have been etched to the source/drain region and shows the subsequent etch result.

The structure of FIG. 8*a* is similar to the structure in FIG. 5, except that in the structure of FIG. 8*a* a doped silicon portion 60*a* replaces TiN portion 36*a* in the structure of FIG. 5, and is formed in a manner substantially similar to the manner described supra for forming the structure of FIG. 5.

First, a nitride layer 45 is established. Next, a thick dielectric layer 46 is deposited over the entire region and flowed smooth, as described supra for the structure in FIG. 5.

A photoresist 50 is then placed on top of the thick dielectric and the thick dielectric layer 46 is etched to expose layer 60*a* which is connected to the source/drain region 28. The side walls resulting from this etch are represented by broken lines 48. As shown in the figure, the side walls 48 terminate on the top surface of portion 60*a* of the doped silicon layer. A portion 46 of thick dielectric layer remains on top of the field-shield isolation structure, and a portion 46 remains on top of the gate electrode structure 18.

The contact window is then widened through the use of a wet etch process which will not etch photoresist 50, doped silicon portion 60*a*, or silicon nitride 45, but will etch the thick dielectric 46. New side walls 52 result, as discussed supra for the structure in FIG. 5.

Figure 8B:
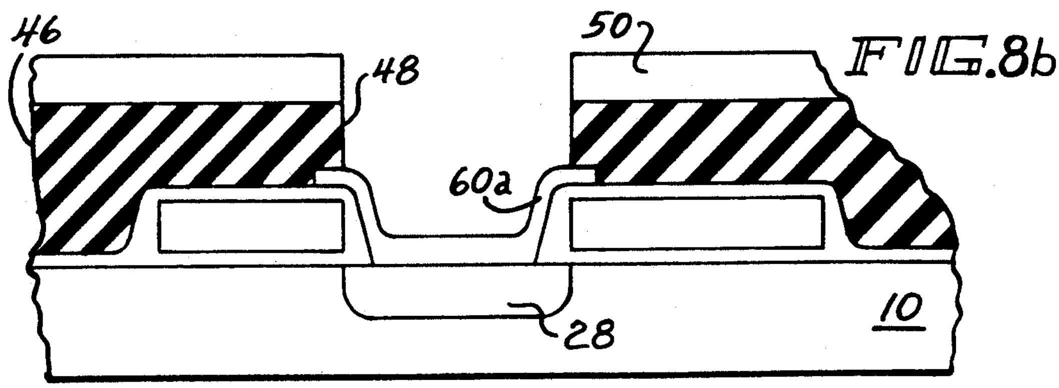
FIG. 8*b* illustrates the structure of FIG. 7 after an interlevel dielectric has been added, and a contact window etched through the interlevel dielectric.

In another embodiment, as shown in FIG. 8*b*, the thick dielectric layer 46 is deposited in a manner similar to that of the embodiment shown in FIG. 8*a* and is comprised of similar materials. However, in this embodiment, further nitride layer 45 is not needed, and typically, would not be deposited.

Next, photoresist 50 is placed on top of the thick dielectric, as shown in FIG. 8*b*, in a manner to that for the embodiment shown in FIG. 8*a*. The thick dielectric layer 46 is etched in a manner similar to that of the embodiment shown in FIG. 8*a* so as to expose layer 60*a* which is connected to the source/drain region 28. The side walls resulting from this etch are represented by lines 48. As shown in the figure, the side walls 48 terminate on the top surface of portion 60*a* of the doped silicon layer. A portion 46 of thick dielectric layer remains on top of the field-shield isolation structure, and a portion 46 remains on top of the gate electrode structure 18. In this embodiment, unlike in the embodiment shown in FIG. 8*a*, the contact window is not widened. Photoresist 50 is then removed.

While the preferred embodiment has been described herein, it will be apparent that various modifications can be made within the scope and spirit of the present invention which is defined by the following claims.

I claim:

1. In an integrated circuit transistor having an electrode to which electrical contact is made and a structure, near said electrode, which is to remain electrically isolated, a contact structure comprising:

- a layer of a doped silicon covering at least part of said electrode at the bottom of the contact and acting as a dopant source for said electrode;
- a layer of a first dielectric located partially outside the contact and partially within the contact, said first dielectric joining said doped silicon within said contact so that the combination of said doped silicon with said first dielectric forms a floor of the contact and seals said structure thereunder;
- said integrated circuit including a second, relatively thick dielectric located over said first dielectric, said second dielectric having a sidewall located outside said doped silicon and above said structure which is to remain electrically isolated, whereby a conductive material can be located within the contact to become coupled electrically to the electrode to which contact is to be made, without becoming electrically shorted to said structure which is to remain electrically isolated, even through said conductive material extends outside the electrode to which contact is to be made and extends over the structure which is to remain electrically isolated.

2. The structure of claim 1 wherein said nearby structure is surrounded by a third dielectric, and wherein said first dielectric is located between said second dielectric and said third dielectric, and wherein said sidewall is located above said nearby structure.

3. The structure of claim 3 wherein said nearby structure comprises a gate electrode of a field effect transistor, and said electrode to which contact is made comprises a source of drain region of said field effect transistor, said gate electrode being covered with said third dielectric, said third dielectric being sealed by said first dielectric and said doped silicon.

4. The structure of claim 3 wherein said third dielectric comprises oxide and said first dielectric comprises silicon nitride.

5. The structure of claim 4 wherein said second dielectric comprises oxide, and wherein said first dielectric comprises silicon nitride.

6. The structure of claim 1 wherein said doped silicon is effective as a dry etch stop and a wet etch stop, and wherein said first dielectric is effective as an isotropic etch stop.

7. In an integrated circuit transistor having a first electrode to which electrical contact is made and a second electrode, near said first electrode, which is to remain electrically isolated, a contact structure comprising:

- insulation surrounding said second electrode;
- a thick dielectric defining at least one sidewall of the contact;
- a doped silicon at the bottom of the contact;
- a nitride located over at least part of the second electrode, the nitride also extending into the bottom of the contact and adjoining the doped silicon, the bottom of the contact being formed by the doped silicon together with the nitride;

said one thick dielectric sidewall overlying the nitride and the second electrode but not overlying the doped silicon;

the doped silicon and nitride together covering said second electrode and said insulation surrounding the second electrode.

8. The structure of claim 7 wherein said second electrode comprises a gate electrode of a field effect transistor, and said first electrode comprises a source or drain region of said field effect transistor, said gate electrode being covered with said insulation, said insulation being sealed by said nitride and said doped silicon.

9. The structure of claim 8 wherein said insulation comprises oxide and said nitride comprises silicon nitride.

10. The structure of claim 7 wherein said nitride comprises silicon nitride.

11. The structure of claim 7 wherein said doped silicon is effective as a dry etch stop and a wet etch stop, and wherein said nitride is effective as an isotropic etch stop.

12. The structure of claim 7 wherein said doped silicon is wholly contained within the contact.

13. The structure of claim 12 wherein said nitride extends beyond said contact.

14. In an integrated circuit transistor having an electrode to which electrical contact is made and a structure, near said electrode, which is to remain electrically isolated, a contact structure comprising:

a layer of a doped silicon covering at least part of said electrode at the bottom of the contact and acting as a dopant source for said electrode;

said integrated circuit including a relatively thick dielectric located partially outside the contact and partially within the contact, said thick dielectric having a sidewall located inside said doped silicon and above said structure which is to remain electrically isolated, whereby a conductive material can be located within the contact to become coupled electrically to the electrode to which contact is to be made, without becoming electrically shorted to said structure which is to remain electrically isolated even though said conductive material extends outside the electrode to which contact is to be made and extends over the structure which is to remain electrically isolated.

* * * * *